(12) United States Patent
Jo et al.

(10) Patent No.: US 6,320,798 B1
(45) Date of Patent: Nov. 20, 2001

(54) SENSE AMPLIFIER OF SEMICONDUCTOR MEMORY DEVICE

(75) Inventors: Soung-woo Jo, Seoul; Hyeun-su Kim, Suwon, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/645,467

(22) Filed: Aug. 23, 2000

(Under 37 CFR 1.47)

(30) Foreign Application Priority Data

Sep. 2, 1999 (KR) .................................................. 99-37105

(51) Int. Cl.$^7$ ........................................................ G11C 7/00
(52) U.S. Cl. ....................................... 365/189.11; 365/205
(58) Field of Search ............................... 365/189.11, 205, 365/207, 203

(56) References Cited

U.S. PATENT DOCUMENTS

| | | | |
|---|---|---|---|
| 5,491,435 | * 2/1996 | Mun et al. ........................... | 327/55 |
| 5,544,110 | * 8/1996 | Yuh ..................................... | 365/205 |
| 5,638,333 | * 6/1997 | Lee ..................................... | 365/205 |
| 5,646,900 | * 7/1997 | Tsukude et al. ..................... | 365/205 |

* cited by examiner

Primary Examiner—Richard Elms
Assistant Examiner—Anh Phung
(74) Attorney, Agent, or Firm—Skjerven Morrill MacPherson LLP; David W. Heid

(57) ABSTRACT

A sense amplifier of a semiconductor memory device has increased driving capability and can reduce the size of a memory device. The sense amplifier includes a pull-up sense amplifier and a pull-down sense amplifier which are connected between a bit line and a complementary bit line to sense data stored in a memory cell, and a pull-up sense driver and a pull-down sense driver each of includes an NMOS transistor. The sense amplifier can reduce the sensing time between the pull-up and pull-down sense drivers starting to operate and a column select line being enabled. The sense amplifier also reduces the time necessary for restoring or refreshing the data or charge in the capacitor of a memory cell after the sensing operation.

12 Claims, 2 Drawing Sheets

SENSE AMPLIFIER OF SEMICONDUCTOR MEMORY DEVICE

BACKGROUND OF THE INVENTION

1. Field of the Invention

The present invention relates to a sense amplifier of a semiconductor memory device.

2. Description of the Related Art

A semiconductor memory device circuit such as a dynamic random access memory (DRAM) uses a sense amplifier to read data from a memory cell or to refresh data in the memory cell. FIG. 1 is a circuit diagram showing a conventional sense amplifier. In FIG. 1, the sense amplifier includes a pull-up sense amplifier 102 and a pull-down sense amplifier 104. The pull-up sense amplifier 102 includes PMOS transistors mp0 and mp1, and the pull-down sense amplifier 104 includes NMOS transistors mn0 and mn1. The MOS transistors mp1 and mp0 (and mn1 and mn0) are connected in series between a bit line BL and a complementary bit line BLB and have gates respectively coupled to the bit line BL and the complementary bit line BLB. The sense amplifier also includes a pull-up sense driver 106 and a pull-down driver 108 that provide and absorb electric charge from the lines BL and BLB via the pull-up sense amplifier 102 and the pull-down sense amplifier 104, respectively. In this sense amplifier, the pull-up sense driver 106 is a PMOS transistor connected between a supply voltage Vdd and a node between PMOS transistors mp0 and mp1, and the pull-down sense driver 108 is an NMOS transistor connected between ground and a node between NMOS transistors mn0 and mn1. The pull-up sense driver 106 and the pull-down sense driver 108 operate as a current source and a current sink, respectively.

FIG. 2 shows a control circuit for generating a signal LAPG and a signal LANG, which respectively operate the pull-up sense driver 106 and the pull-down sense driver 108 shown in FIG. 1. The control circuit of FIG. 2 includes a NAND gate 202 and three inverters 204, 206, and 208. When both input signals PS and PBLSIJ to the NAND gate 202 are in a "high" state, the output signal from the NAND gate 202 is in a "low" state. Accordingly, the signal LANG, which is the output of a first inverter 204, is in a "high" state, and the signal LAPG, which is the output of a third inverter 208, is in a "low" state. When signals PS and PBLSIJ are in the "high" state, the signal LANG turns on the pull-down sense driver 108, and the signal LAPG turns on the pull-up sense driver 106 for a sensing operation in the circuit of FIG. 1.

As illustrated in FIG. 1, the conventional sense amplifier uses a PMOS transistor as the pull-up sense driver 106 for providing electric charge to a line LA, and uses an NMOS transistor as the pull-down sense driver 108 for absorbing electric charge from a line LAB.

Sense amplifies such as in FIG. 1 must be adapted as the capacity of memory cell arrays increases. For example, conventional memory cell arrays were 128 Kbits in capacity, but are now increasing to 192 Kbits or 256 Kbits to decrease the chip size of semiconductor devices. As the capacities of memory arrays increase, bit lines are becoming thinner and longer, which increases the resistance and capacitance of the bit lines. The driving capability of the pull-up sense driver 106 and the pull-down sense driver 108 must correspondingly increase with the array capacity. Additionally, PMOS transistors respond to an activation signal more slowly than would an NMOS transistor of the same size. Accordingly, to equalize the response of the pull-up sense driver 106 (realized by a PMOS transistor) with that of the pull-down sense driver 108 (realized by the NMOS transistor), the width of the PMOS transistor needs to be larger than that of the NMOS transistor. However, the larger PMOS transistors (being present in all of the sense amplifiers of the memory) increase chip size and reduce the advantage obtained from a larger capacity memory cell array.

SUMMARY OF THE INVENTION

An embodiment of the present invention provides a sense amplifier that is small and has an increased driving capability and thereby permits reduction of the chip size of memory devices employing the sense amplifier.

One embodiment of the invention is a sense amplifier including a pull-up sense amplifier, a pull-down sense amplifier, a pull-up sense driver, and a pull-down sense driver. The pull-up and pull-down sense amplifiers sense the data of a memory cell and are connected between a bit line and a complementary bit line. The pull-up sense driver includes an NMOS transistor that provides the pull-up sense amplifier with electric charge, and a pull-down sense driver includes an NMOS transistor that absorbs electric charge from the pull-down sense amplifier. The two NMOS transistors can be of the same dimensions, which reduces the chip area conventionally required for a larger PMOS transistor in the pull-up sense driver.

In the sense amplifier, the electric potential of a signal which drives the pull-up sense driver is preferably higher than that of a signal which drives the pull-down sense driver and/or higher than a supply voltage for the pull-up sense driver.

BRIEF DESCRIPTION OF THE DRAWINGS

The above features and advantages of the present invention will become more apparent by describing in detail a preferred embodiment thereof with reference to the attached drawings in which.

DETAILED DESCRIPTION OF THE INVENTION

Figure 3:
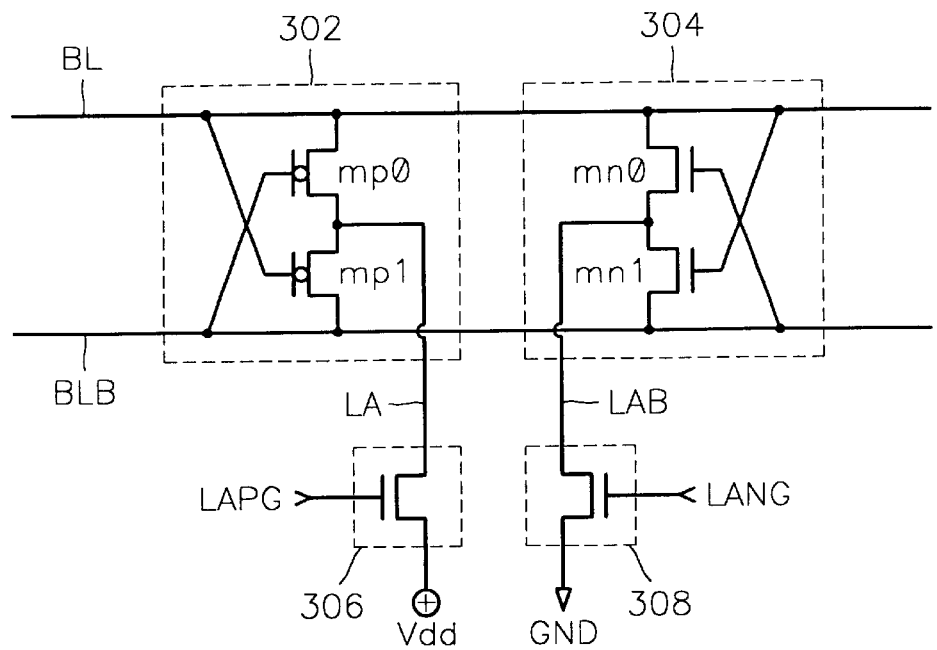
FIG. 3 is a circuit diagram of a sense amplifier according to the present invention.

FIG. 3 is a circuit diagram showing a sense amplifier according to an embodiment of the present invention. The sense amplifier of FIG. 3 includes a pull-up sense amplifier 302 and pull-down sense amplifier 304, which respectively include a pair of PMOS transistors mp0 and mp1 and a pair of NMOS transistors mn0 and mn1. The PMOS transistors mp1 and mp0 are connected in series between a bit line BL and a complementary bit line BLB and have gates respectively coupled to the bit line BL and the complementary bit line BLB. Similarly, the NMOS transistors mn1 and mn0 are connected in series between and have gates respectively coupled to the bit line BL and the complementary bit line BLB. A pull-up sense driver 306 connects via a line LA to a node between PMOS transistors mp0 and mp1 and provides electric charge for the pull-up sense amplifier 302. A pull-down sense driver 308 connects via a line LAB to a node between NMOS transistors mn0 and mn1 and absorbs electric charge from the pull-down sense amplifier 304. In accordance with an aspect of the invention, each of the pull-up sense driver 306 and the pull-down sense driver 308 is an NMOS transistor.

At the initial stage of a sensing operation, an equalization circuit (not shown) equalizes the voltages of the bit line BL and the complementary bit line BLB to precharge voltage ½Vbl. When a word line (not shown) is enabled so that a cell transistor connects the bit line BL to a capacitor that is charged to a "high" level, charge-sharing increases the voltage of the bit line BL to a level higher than that of the complementary bit line BLB. Similarly, if the connected capacitor is uncharged, charge-sharing reduces the voltage of the bit line BL. By the time the charge sharing is completed, the pull-up sense driver 306 and the pull-down sense driver 308 start driving the electric potential of the line LA from ½Vbl to the supply voltage Vdd level and the electric potential of the line LAB from ½Vbl to ground (0 V).

When the capacitor in the memory cell being read is charged to the high state, the electric potential of the gate of a transistor mn1 becomes higher than that of the gate of a transistor mn0, and electric charge of the complementary bit line BLB runs into the line LAB through the transistor mn1. Accordingly, the electric potential of the complementary bit line BLB falls. Similarly, the line LA supplies electric charge to the bit line BL through the transistor mp0 and thereby increases the electric potential of the bit line BL. This forms a feed-back loop that amplifies a small voltage difference between bit lines BL and BLB and raises the electric potential of the bit line BL up to the supply voltage Vdd level while bringing the electric potential of the complementary bit line down BLB to ground voltage (0 V). When the electric potential difference between the bit line BL and the complementary bit line BLB reaches an appropriate level, a column select transistor (not shown), controlled by column select line (not shown) turns on to transmit the sensed data to an input-output line (not shown).

In the sense amplifier of FIG. 3, both the pull-up sense driver 306 and the pull-down sense driver 308 are NMOS transistors. The NMOS transistors in drivers 306 and 308 provide fast responses while avoiding an increase in the chip size of a semiconductor memory device that results from using PMOS transistors with similar driving capabilities and speed. The fast response of the drivers 306 and 308 decreases the sensing time between when the drivers 306 and 308 start operating and when the column select line is enabled. Similarly, a refresh time necessary for refreshing the data in the capacitor of a memory cell can be reduced. In comparison with the conventional sense amplifier shown in FIG. 1, the sense amplifier according to the present invention when using the same chip area can reduce the sensing time by 1–2 ns, so there is no need to delay an enable time of the column select line. The refresh time can be shortened by more than 10 ns.

Figure 4:
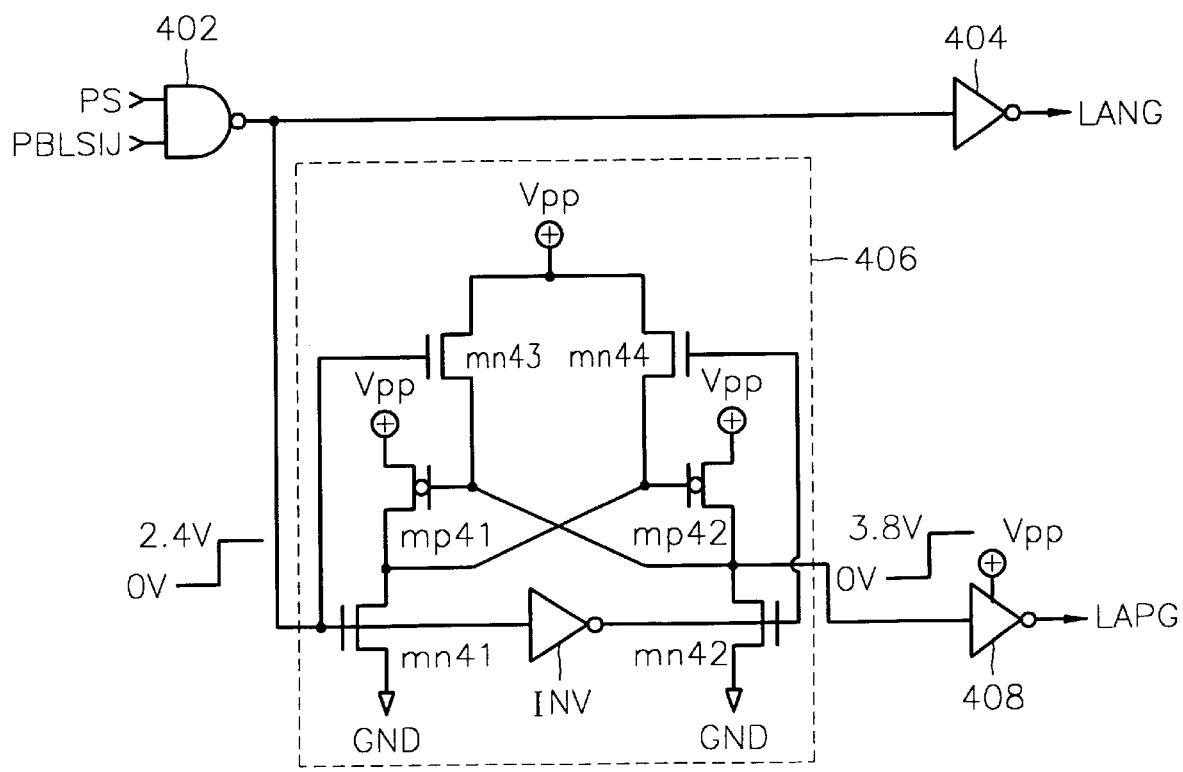
FIG. 4 is a circuit diagram of a control circuit that generates signals LAPG and LANG that control a pull-up sense driver and a pull-down sense driver, respectively, shown in FIG. 3.

FIG. 4 shows a control circuit for activating the pull-up sense driver 306 and the pull-down sense driver 308 shown in FIG. 3. The control circuit includes a NAND gate 402, two inverters 404 and 408, and a level shifter 406. The NAND gate 402 receives signals PS and PBLSIJ and outputs the NAND operation result to the inverter 404 and the level shifter 406. The inverter 404 inverts the output signal of the NAND gate 402 to generate the signal LANG, and the level shifter 406 and the inverter 408 respectively buffer and invert the output of the NAND gate 402 to generate the activated level of the signal LAPG. As a result, the outputs from the inverter 404 and the inverter 408 are of the same logic level, but as described further below, inverter 408 boosts the activated level of the signal LAPG above the voltage Vdd or the activated level of the signal LANG.

When the signals PS and PBLSIJ are both high, the output from the NAND gate 402 is low. Accordingly, the signal LANG from the inverter 404 and the signal LAPG from the inverter 408 are high. Signal LANG turns on the pull-down sense driver 308, and the signal LAPG turns on the pull-up sense driver 306 to start the pull-up sense amplifier 302 and the pull-down sense amplifier 304 on a sensing operation.

The pull-up sense amplifier 302 includes the PMOS transistors mp0 and mp1. As is well known, the mobility of holes in the PMOS transistors mp0 and mp1 is lower than the mobility of electrons in the NMOS transistors of the pull-down sense amplifier 304. Therefore, if the pull-up sense driver 306 and the pull-down sense driver 308 are the same size, the driving capability of the pull-up sense driver 306 needs to be increased. In the present invention, the level shifter 406 and inverter 408 increase the driving capability of the pull-up sense driver 306 by raising the active voltage level of the signal LAPG higher than that of the signal LANG.

In the preferred embodiment according to the present invention, the input voltage of the level shifter 406 is 0–2.4 V, and the output voltage is 0–3.8 V. For operation of the level shifter 406 an electric potential of 3.8 V is applied as a supply voltage Vpp. Voltage Vpp is also applied as the supply voltage of the inverter 408.

In the control circuit of FIG. 4, if the output from the NAND gate 402 is "high", NMOS transistors mn41 and mn43 are on, and the output from an inverter INV is "low", turning off NMOS transistors mn42 and mn44. The transistor mn41 pulls down the gate of a PMOS transistor mp42, so that the transistor mp42 turns on and pulls up the output signal of the level shifter 406 to the voltage Vpp. In addition, since the output (high) from the NAND gate 402 turns the transistor mn43 on and the output (high) from the level shifter 406 turns the transistor mp41 off, the output from the level shifter 406 is latched to the Vpp level.

If the output from the NAND gate 402 is low, the transistors mn41 and mn43 are off, and the output from the inverter INV is high, turning on the transistors mn42 and mn44. Accordingly, the transistor mn44 turns off the transistor mp42, so the output signal from the level shifter 406 is low (0 V). In addition, the output signal being low turns on the transistor mp41, which keeps transistor mp42 off and latches the output from the level shifter 406 to the low level (0 V). The inverter 408 receives and inverts the low electric potential to output the Vpp level. In other words, the operations of the level shifter 406 and the inverter 408 raise the voltage of the signal LAPG when activating the pull-up sense driver 306 higher than the voltage of the signal LANG when activating the pull-down sense driver 308. This increases the drive of the driver 306 and increases the maximum voltage on line LA to voltage Vdd since the difference between the voltages Vpp and Vdd is greater than the threshold voltage of the NMOS transistor in the driver 306.

Figure 1:
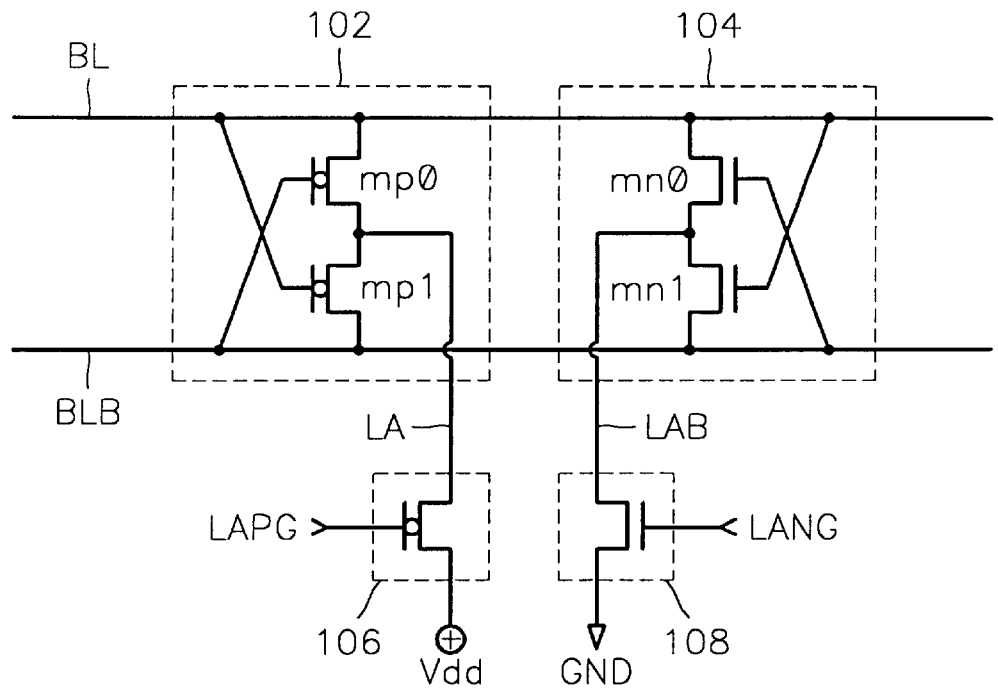
FIG. 1 is a circuit diagram of a conventional sense amplifier.
Figure 2:
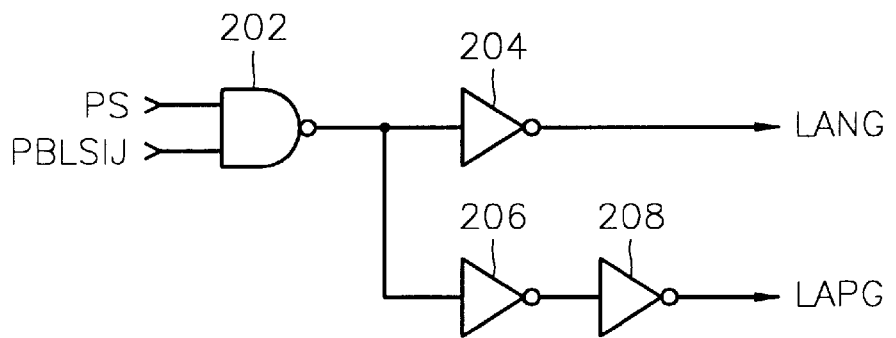
FIG. 2 is a circuit diagram of a control circuit that generates signals LAPG and LANG that control a pull-up sense driver and a pull-down sense driver, respectively, shown in FIG. 1.

A memory including the sense amplifier of FIG. 3 does not need to delay the column select time. When compared to the sense amplifier of FIG. 1, the sense amplifier of FIG. 3 reduces sensing time by 1–2 ns and shortens the refresh time by 10 ns, when the NMOS transistor in the driver 306 (FIG. 4) has the same size as the PMOS transistor in the driver 106 (FIG. 1).

The sense amplifier of FIG. 3 can be implemented with a triple well process and structure. A triple well refers to a structure in which an upper well (e.g., a p-well) is within the boundaries of a lower well (e.g., an n-well) in a substrate. Active regions (e.g., n-type source/drain regions of NMOS transistors) are in the upper well (e.g., the p-well), and other active regions (e.g., p-type source/drain regions of PMOS transistors) are in parts of the lower well surrounding the upper well. Processes for making such triple well structures are known in the art. In the sense amplifier of FIG. 3, a triple well structure permits reduction of the length of the NMOS transistors and the distance between the driver 306 and the pull-up sense amplifier 302 when compared to devices implementing NMOS transistors in a twin well isolation structure. If the fabrication of the sense amplifier of FIG. 3 uses the triple well process, the triple well can focus the features of the NMOS transistor in the core area to improve the process, regardless of a P/N ratio of the core and peripheral areas of the chip.

As described above, since both the pull-up sense driver and the pull-down sense driver are implemented by the NMOS transistors according to the present invention, the sensing time and the time for restoring data can be reduced.

Although the invention has been described with reference to a particular embodiment, the description is only an example of the invention's application and should not be taken as a limitation. Various adaptations and combinations of features of the embodiment disclosed are within the scope of the invention as defined by the following claims.

What is claimed is:

1. A sense amplifier of a semiconductor memory device, the sense amplifier comprising:
    a pull-up sense amplifier and a pull-down sense amplifier coupled between a bit line and a complementary bit line;
    a pull-up sense driver comprising a first NMOS transistor that supplies electric charge to the pull-up sense amplifier; and
    a pull-down sense driver comprising a second NMOS transistor that absorbs electric charge from the pull-down sense amplifier.

2. A sense amplifier of a semiconductor memory device, the sense amplifier comprising:
    a pull-up sense amplifier and a pull-down sense amplifier coupled between a bit line and a complementary bit line;
    a pull-up sense driver comprising a first NMOS transistor that supplies electric charge to the pull-up sense amplifier; and
    a pull-down sense driver comprising a second NMOS transistor that absorbs electric charge from the pull-down sense amplifier,
    wherein an electric potential of a first activation signal when activating the pull-up sense driver is higher than that of a second activation signal when activating the pull-down sense driver.

3. The sense amplifier of claim 2, wherein the first activation signal activates the pull-up sense driver by turning on the first NMOS transistor, and the second activation signal activates the pull-down sense driver by turning on the second NMOS transistor.

4. The sense amplifier of claim 3, wherein dimensions of the first and second NMOS transistors are the same.

5. The sense amplifier of claim 4, wherein a difference between the electrical potential of the first activation signal and the electrical potential of the second activation signal compensates for reduced mobility of charge carriers in PMOS transistors in the pull-up sense amplifier.

6. A sense amplifier of a semiconductor memory device, the sense amplifier comprising:
    a pull-up sense amplifier and a pull-down sense amplifier coupled between a bit line and a complementary bit line;
    a pull-up sense driver comprising a first NMOS transistor that supplies electric charge to the pull-up sense amplifier;
    a pull-down sense driver comprising a second NMOS transistor that absorbs electric charge from the pull-down sense amplifier; and
    a control unit that generates a first signal to activate the pull-up sense amplifier and a second signal to activate the pull-down sense amplifier, wherein an electric potential of the first signal when activating the pull-up sense amplifier is higher than an electric potential of the second signal when activating the pull-down sense amplifier.

7. A sense amplifier of a semiconductor memory device, the sense amplifier comprising:
    a pull-up sense amplifier and a pull-down sense amplifier coupled between a bit line and a complementary bit line;
    a pull-up sense driver comprising a first NMOS transistor that supplies electric charge to the pull-up sense amplifier; and
    a pull-down sense driver comprising a second NMOS transistor that absorbs electric charge from the pull-down sense amplifier,
    wherein the sense amplifier has a triple well structure.

8. A sense amplifier of a semiconductor memory device, the sense amplifier comprising:
    a pull-up sense amplifier and a pull-down sense amplifier coupled between a bit line and a complementary bit line;
    a pull-up sense driver comprising a first NMOS transistor that supplies electric charge to the pull-up sense amplifier; and
    a pull-down sense driver comprising a second NMOS transistor that absorbs electric charge from the pull-down sense amplifier, wherein
    the pull-up sense amplifier comprises:
        a first PMOS transistor connected between the bit line and a node; and
        a second PMOS transistor connected between the node and the complementary bit line; and
    the first NMOS transistor is coupled between the node and a first voltage.

9. The sense amplifier of claim 8, further comprising a control circuit that generates an activation signal that activates the pull-up sense driver for a sense operation, wherein a state of the activation signal that activates the pull-up sense driver has a second voltage that is greater than the first voltage.

10. The sense amplifier of claim 8, wherein:
    the pull-down sense amplifier comprises:
        a third NMOS transistor connected between the bit line and a second node; and
        a fourth NMOS transistor connected between the second node and the complementary bit line; and the second NMOS transistor is coupled between the second node and a reference voltage.

11. The sense amplifier of claim 10, wherein dimensions of the first NMOS transistor are the same as those of the second NMOS transistor.

12. The sense amplifier of claim 11, further comprising a control circuit that generates first and second activation signals that respectively activate the pull-up sense driver and the pull-down sense driver for a sense operation, wherein the first and second activation signals are in respective active-high states when activating respective pull-up and pull-down sense drivers, the active-high state of the first activation signal having a voltage higher than that of the active-high state of the second activation signal.

\* \* \* \* \*